United States Patent [19]

Hong

[11] Patent Number: 4,598,255

[45] Date of Patent: Jul. 1, 1986

[54] POWER AMPLIFIER APPARATUS

[75] Inventor: Min-Tai Hong, Taipei, Taiwan

[73] Assignee: Fulet Electronic Industrial Company, Tapiei-Hsien, Taiwan

[21] Appl. No.: 726,041

[22] Filed: Apr. 23, 1985

[51] Int. Cl.[4] .......................... H03F 3/04; H03F 3/26
[52] U.S. Cl. .................................. 330/297; 330/135; 330/262
[58] Field of Search ............... 330/127, 135, 297, 262, 330/267, 270, 273

[56] References Cited

U.S. PATENT DOCUMENTS

| | | | |
|---|---|---|---|
| 3,319,175 | 5/1967 | Kramer | 330/297 |
| 3,396,326 | 8/1968 | Kisrow | 323/17 |
| 3,426,290 | 2/1969 | Jensen | 330/297 |
| 3,483,425 | 12/1969 | Yanishevsky | 307/235 |
| 3,564,393 | 2/1971 | Williamson | 323/17 |
| 3,581,187 | 5/1971 | Grady, Jr. | 323/17 |
| 3,585,517 | 6/1971 | Herbert | 330/10 |
| 3,622,899 | 11/1971 | Eisenberg | 330/297 |
| 3,722,606 | 11/1973 | Waehner | 330/297 |
| 3,740,640 | 6/1973 | Ravas et al. | 323/17 |
| 3,745,443 | 7/1973 | Weil | 323/17 |
| 3,863,140 | 1/1975 | Easter et al. | 323/17 |
| 3,873,903 | 3/1975 | Koetsch et al. | 323/17 |
| 3,931,567 | 1/1976 | Kostecki | 323/17 |
| 3,961,280 | 6/1976 | Sampei | 330/297 |
| 4,054,843 | 10/1977 | Hamada | 330/297 |
| 4,218,660 | 8/1980 | Carver | 330/297 |
| 4,329,657 | 5/1982 | Kamiya | 330/297 |
| 4,339,730 | 7/1982 | Yokoyama | 330/297 |
| 4,403,201 | 9/1983 | Yokoyama | 330/204 |
| 4,423,389 | 12/1983 | Fushiki | 330/297 |
| 4,447,791 | 5/1984 | Noro et al. | 330/297 |
| 4,498,057 | 2/1985 | Noro | 330/297 |
| 4,520,322 | 5/1985 | Ishii | 330/297 |
| 4,535,303 | 8/1985 | Schoofs et al. | 330/297 |

FOREIGN PATENT DOCUMENTS 1571423  7/1980  United Kingdom .

*Primary Examiner*—Gene Wan
*Attorney, Agent, or Firm*—Willian Brinks Olds Hofer Gilson & Lione Ltd

[57] ABSTRACT

Audio power amplifier in which dynamic power output can be increased without increasing continuous power output. The apparatus includes an amplifying means for receiving an input signal and for producing an amplified output signal, first means for supplying a first, relatively low supply voltage to the amplifying means, second means for supplying a second, relatively high supply voltage to the amplifying means, and control means for supplying the first supply voltage to the amplifying means when the level of the amplified output signal is less than the first supply voltage and for supplying the second supply voltage to the amplifying means when the level of the output signal exceeds the first supply voltage. The invention thus provides an amplifier apparatus having relatively low power dissipation and high efficiency and that will avoid any output signal clipping that will distort the output signal.

19 Claims, 8 Drawing Figures

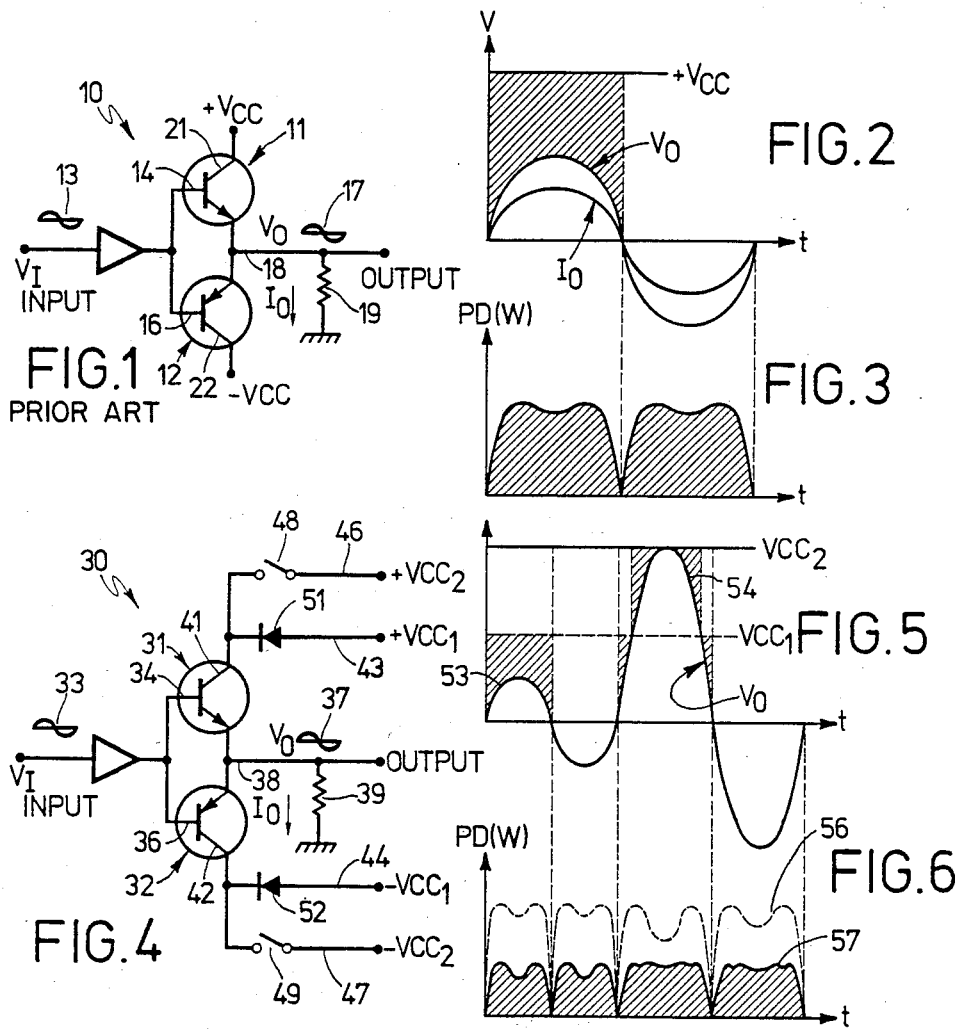

POWER AMPLIFIER APPARATUS

BACKGROUND OF THE INVENTION

The present invention relates generally to the field of power amplifiers, and, more particularly, to an audio power amplifier in which dynamic power output can be increased without increasing continuous power output.

On factor that is particularly important in connection with power amplifiers is power conversion efficiency which measures the ability of an amplifying device to convert the DC power of the bias supply into the AC power delivered to an external load.

For the efficiency of a power amplifier to be very high, the power dissipation on the amplifying device should be kept very low. The power dissipation (PD) on an amplifying device can be defined as follows:

$$PD = (V_{cc} - V_0) I_0$$

where $V_{cc}$ is the supply voltage
$V_0$ is the output voltage and
$I_0$ is the output current.

If the supply voltage is very high as compared to the output voltage, the power dissipation on the device will be high and the efficiency of the amplifier will be low. For maximum efficiency, the supply voltage should be the same or only slightly greater than the output voltage.

Notwithstanding the desirability of maintaining the supply voltage at approximately the level of the output voltage for maximum efficiency, when the amplifier is used in an audio system, it is also important that the supply voltage be sufficiently high to insure that it will always be greater than the output voltage. If the output signal level becomes greater than the supply voltage at any time, output signal clipping will occur resulting in distortion of the amplified signal.

Accordingly, in the usual audio power amplifier system, the supply voltage is maintained at a level sufficient to accommodate the maximum anticipated output signal level. This results in relatively high power dissipation and relatively low amplifier efficiency during periods when the input signal is not at its peak.

In addition, in order to maintain the supply voltage at a sufficiently high level to accommodate all anticipated output signal levels, a power supply with high power output must be utilized to maintain a continuous power output at the necessary level at all times, even though a high power output will usually only be needed during relatively brief periods during the operation of the audio system.

SUMMARY OF THE INVENTION

According to the present invention, an amplifier apparatus is provided which is adapted to provide two different supply voltages to an amplifying means. More particularly, the invention comprises an amplifier apparatus which includes an amplifier circuit for receiving an input signal and for producing an amplified output signal corresponding to the input signal; first means for supplying a first, relatively low supply voltage to the amplifying means; second means for supplying a second, relatively high supply voltage to the amplifying means; and a control means for coupling the first means to the amplifying means when the level of the amplified output signal is less than the first supply voltage, and for coupling the second means to the amplifying means when the level of the output signal is greater than the first supply voltage.

When used as an audio power amplifier, the value of the first supply voltage is preferably chosen to slightly exceed the output signal level that is likely to be encountered a substantial majority of the time during the operation of the audio system. When, however, the audio source is such that the output signal level exceeds the first supply voltage, the control means automatically connects the amplifying means to the second means to supply the second, higher supply voltage to the amplifying means during such periods when the high supply voltage is required to avoid output signal clipping.

With the present invention, very high dynamic power can be delivered to the amplifying means when required to match various music sources or the like. When the high supply voltage is not needed, however, the apparatus will operate with a more moderate supply voltage level. Accordingly, the power dissipation of the amplifying device will be maintained relatively low at all times; and the efficiency of the amplifier will be relatively high.

With the invention, the amplifier apparatus can efficiently power an audio system, providing relatively distortionless output during such larger input signal excursions as are produced by drums, timpani, bass and other sudden and loud noise in the audio signal.

In addition, the present invention permits such high dynamic power to be delivered to the amplifying means when it is needed without having to increase continuous output power. This avoids the need to provide a larger power transformer or other power source in the apparatus.

According to a presently preferred embodiment, the first and second supply voltages are supplied to the amplifying means from a power transformer. Under normal conditions, when the first lower supply voltage exceeds the output signal level, the first supply voltage will be delivered to the amplifying means, while the second supply voltage will be prevented from being delivered to the amplifying means by a normally open switch means in the line coupling the second means to the amplifying means. The control means includes means for monitoring the output signal level; and when that level exceeds the first supply voltage, the control means causes the switch means to be closed, permitting the second supply voltage to be supplied to the amplifying means.

After a predetermined period of time, which can be preset by the control means, the switch means will return to an open state causing the first supply voltage to again be supplied to the amplifying means.

The amplifier will be described for use in one channel of an audio system. It will be understood, however, that the invention can be used in a stereo or quadraphonic audio system. Further details of the invention will be set out hereinafter in conjunction with the detailed description of a presently preferred embodiment thereof.

BRIEF DESCRIPTION OF THE DRAWINGS

FIG. 1 illustrates a typical Class B amplifier circuit to illustrate the advantages of the present invention;

FIGS. 2 and 3 graphically illustrate the operation of the circuit of FIG. 1;

FIG. 4 illustrates an amplifier circuit in accordance with the present invention;

FIGS. 5 and 6 graphically illustrate the operation of the circuit of FIG. 4;

DETAILED DESCRIPTION OF THE PREFERRED EMBODIMENT

Figure 7:
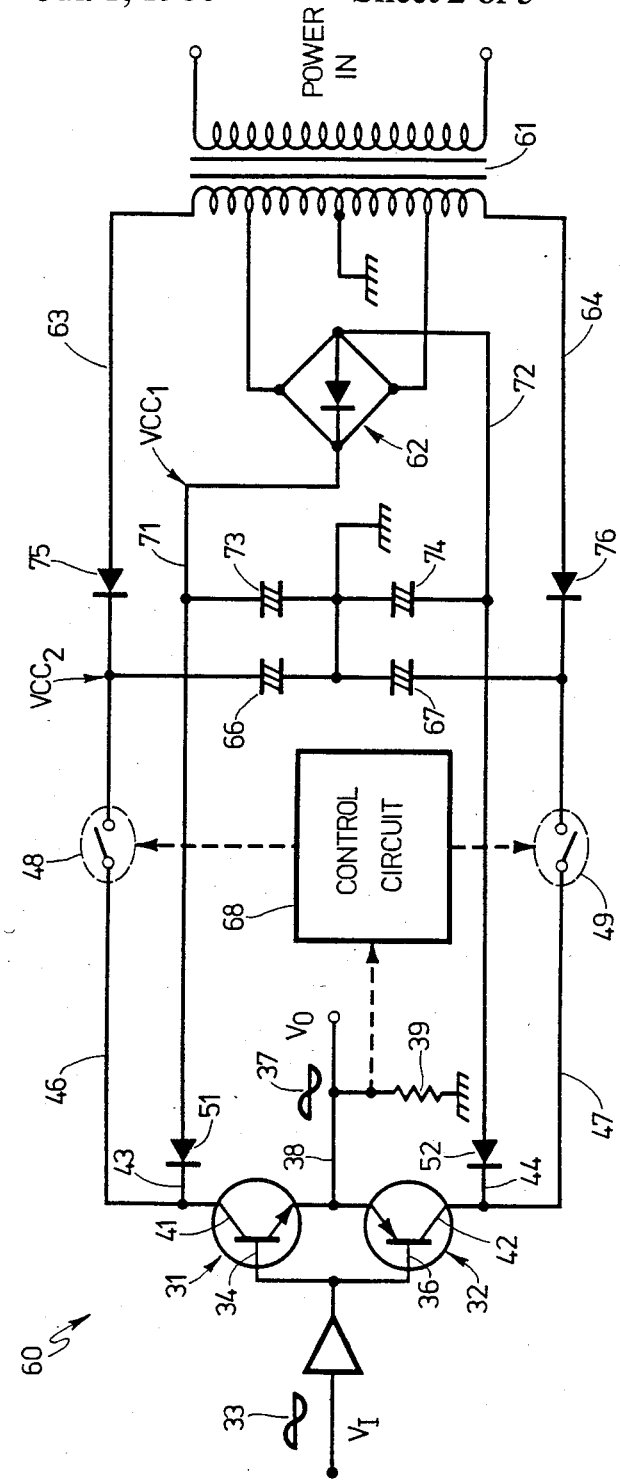
FIG. 7 ilustrates an amplifier circuit according to a preferred embodiment of the present invention.

As is well known to those skilled in the art, there are several different types of power amplifiers which are distinguished from one another in terms of their bias settings and signal amplitudes. From a power efficiency point of view, the most efficient amplifier is a Class H amplifier while Class A amplifiers have the lowest power efficiency. Other classes, such as Class B and Class AB, have intermediate levels of efficiency.

FIG. 1 illustrates a typical Class B amplifier circuit 10 incorporating NPN and PNP bipolar transistors 11 and 12, respectively, connected as shown. A sinusoidal input signal 13 to be amplified is applied to the bases 14 and 16 of the transistors 11 and 12, respectively; while an amplified output signal 17 corresponding to the input signal is produced on line 18 coupled to a load schematically represented by load resistance 19.

The amplifier is powered by positive and negative supply voltges $+V_{cc}$ applied to the collectors 21 and 22 of the transistors 11 and 12, respectively, as illustrated.

As is known to those skilled in the art, when the power amplifier circuit 10 is used in an audio system, it is important that the value of $V_{cc}$ exceeds the value of the output signal at all times to avoid output signal clipping resulting in distortion of the amplified output signal. As a result, $V_{cc}$ must be set to a level that will exceed the maximum output signal level likely to be encountered in the operation of the audio system. This means that during the majority of the time, $V_{cc}$ will be significantly greater than the output signal voltage resulting in a high power dissipation on the transistors 11 and 12 during those periods and a low amplifier efficiency.

This is graphically illustrated in FIGS. 2 and 3. Specifically, the power dissipation PD on transistor 11 is:

$$PD = (V_{cc} - V_0) I_0$$

where $V_{cc}$ is the supply voltage applied to collector 21, $V_0$ is the output signal voltage across load resistance 19, and $I_0$ is the output current.

From FIGS. 2 and 3, it can be seen that when $V_{cc}$ is very high as compared to $V_0$, as indicated by the shading in FIG. 2, the power dissipation on transistor 11 will be very high and the efficiency of the device will be very low. This is also true, of course, of transistor 12 of the amplifier.

FIG. 4 schematically illustrates a power amplifier circuit 30 to help explain the present invention. The circuit of FIG. 4 is preferably biased for Class H operation and includes NPN and PNP transistors 31 and 32, respectively, connected as in FIG. 1. A sinusoidal input signal 33 is applied to the bases 34 and 36 of the transistors, and an amplified output signal 37 is produced on line 38 coupled to a load as represented by load resistance 39.

The circuit of FIG. 4 differs from the circuit of FIG. 1 in that it contains two different supply voltages designated as $\pm V_{cc1}$ and $\pm V_{cc2}$, which are adapted to be applied to the collectors 41 and 42 of the transistors 31 and 32 as shown in FIG. 4.

In the present invention, $V_{cc1}$ is a relatively low supply voltage chosen to slightly exceed the output signal level a substantial majority of the time during the operation of the audio system within which the amplifier circuit is incorporated, while $V_{cc2}$ is a relatively high supply voltage chosen to exceed the maximum output signal level likely to be encountered in operation of the audio system.

The $+V_{cc1}$ voltage and the $-V_{cc1}$ voltage are adapted to be applied to collectors 41 and 42, respectively, via lines 43 and 44, respectively; and the $+V_{cc2}$ and $-V_{cc2}$ voltages are adapted to be applied to collectors 41 and 42 via lines 46 and 47 and switching means 48 and 49, respectively.

As long as the peaks of the signal level of output signal 37 is less than the value of the $V_{cc1}$ voltages, the $V_{cc1}$ voltages are applied to the collectors 41 and 42. When, however, one or more peaks of the level of output signal 37 exceeds the value of the $V_{cc1}$ voltage, one or both of switches 48 and 49 in lines 46 and 47, respectively, will be closed (turned on) to supply $\pm V_{cc2}$ to one or both collectors 41 and 42, respectively. Under such conditions, one or both diodes 51 and 52 in lines 43 and 44 become reverse biasing such that the supply voltage will only be from $\pm V_{cc2}$ supply. Diodes 51 and 52 prevent the $\pm V_{cc2}$ voltage from affecting the $\pm V_{cc1}$ supply. Under most operating conditions, such transient signal peaks will occur in both the positive and negative half cycles and continue for several cycles.

As long as the peak level of output signal 37 is lower than $V_{cc1}$ or if there is a continuous input signal 33, the switches 48 and 49 will not be closed; and the supply voltage will remain at $V_{cc1}$. Thus, there will be no power loss from the $\pm V_{cc2}$ supply during the substantial majority of the time the audio system is operating.

FIGS. 5 and 6 graphically illustrate the improved performance attainable by the circuit of FIG. 4, incorporating the present invention. As shown in FIG. 5, when the peak of the output signal is at 53 which is less than $V_{cc1}$, the supply voltage will be at the $V_{cc1}$ voltage. When, however, the peak of the output signal exceeds the $V_{cc1}$ voltage, as illustrated at 54, the voltage supplied to the collector 41 of transistor 31 will be at the $V_{cc2}$ voltage as a result of the action of switching means 48. From the shading in FIGS. 5 and 6, it can be seen that the power dissipation on the transistors will be substantially reduced; and the efficiency of the amplifier will be relatively high. The dashed line 56 in FIG. 6 illustrates what the power dissipation would be if only $V_{cc2}$ was applied to the amplifier as was the case in the FIG. 1 circuit with $\pm V_{cc}$ voltage level at $\pm V_{cc2}$. The solid line 57 illustrates the power dissipation of the circuit of FIG. 4 under such operating conditions.

FIG. 7 illustrates a practical audio power amplifier circuit 60 according to a presently preferred embodiment for automatically supplying the required supply voltage to the amplifier stage of the circuit. In FIG. 7, corresponding components are identified by the same reference numerals as in FIG. 4.

Power is supplied to the amplifier stage from a power transformer 61. The supply voltages at $\pm V_{cc1}$ are supplied to lines 43 and 44 from a full wave rectifier bridge circuit 62 and filter capacitors 73 and 74, respectively;

and during normal operation of the audio system incorporating the amplifier circuit of FIG. 7, the $\pm V_{cc1}$ supply voltage will be supplied to the collectors 41 and 42 of transistors 31 and 32, respectively. During operation of the circuit at a $V_{cc1}$ supply voltage, switches 48 and 49 will be open (off), preventing the $V_{cc2}$ supply voltage from being supplied to transistors 31 and 32. The $\pm V_{cc2}$ voltages will be generated by the half wave rectifier systems including filter capacitors 66 and 67 and rectifiers 75 and 76, but no power will be drawn from the $\pm V_{cc2}$ supply. Energy from the transformer 61 will be stored in capacitors 66 and 67, respectively, until it is needed in the output signal.

A power control circuit, schematically represented at 68 in FIG. 7, monitors the level of amplified output signal 37; and when the peak of signal 37 exceeds the value of the $V_{cc1}$ voltage, circuit 68 operates switches 48 and 49. This connects the collectors 41 and 42 respectively to the filter/storage capacitors 66 and 67, respectively, of the $\pm V_{cc2}$ supply and permits the energy stored in capacitors 66 and 67 to be supplied to the transistors at the $\pm V_{cc2}$ voltage level and thus supply the needed output power.

At this time, diodes 51 and 52 are reverse biasing and protect the $\pm V_{cc1}$ supply from the higher $V_{cc2}$ voltage.

The power control circuit 68 is preferably adapted so that the switches 48 and 49 are turned off, causing the $V_{cc1}$ supply voltage to again be supplied to the transistors, at all times when the output signal level is less than the $V_{cc1}$ voltage level.

Figure 8:
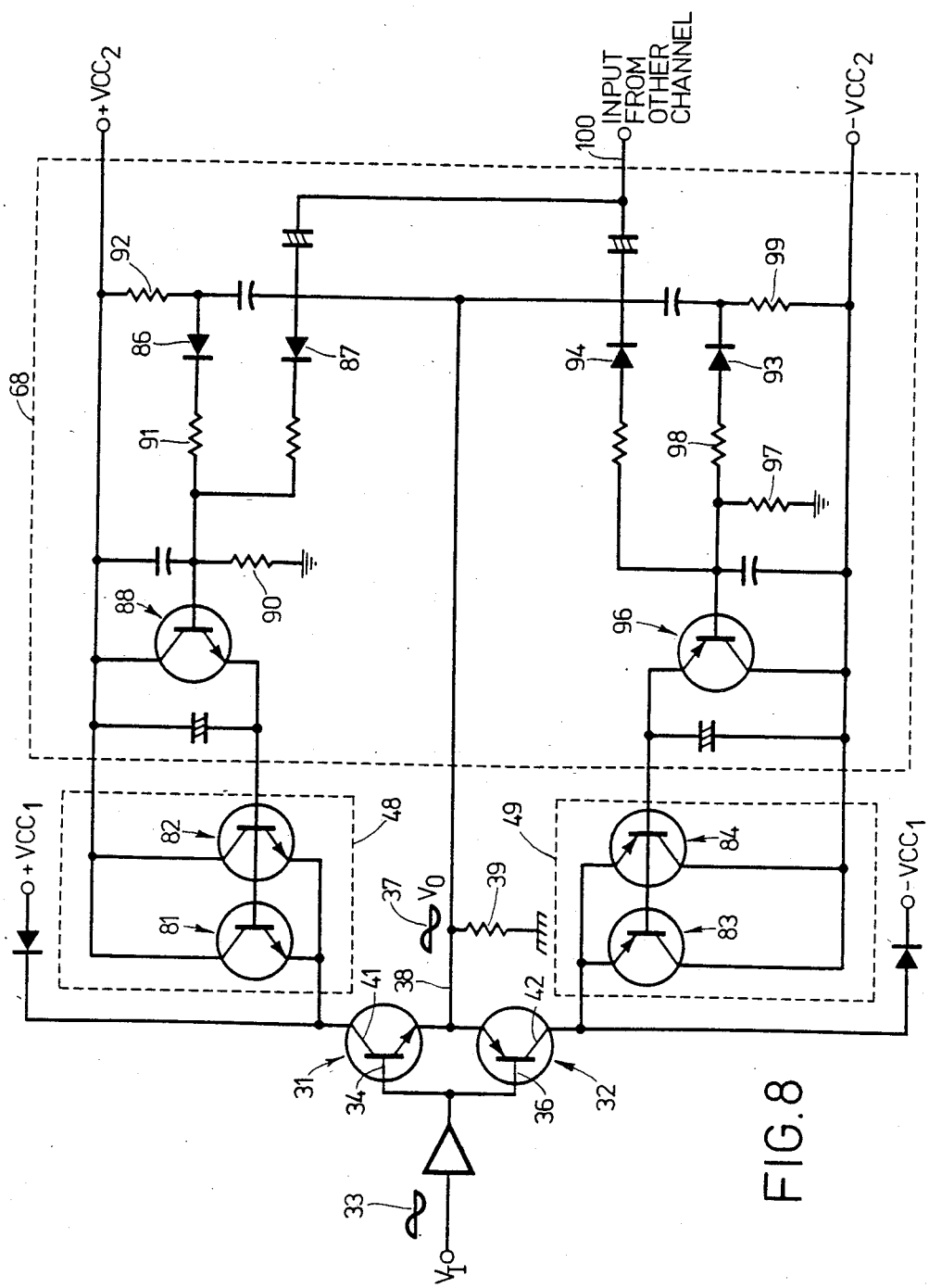
FIG. 8 illustrates a portion of the circuit of FIG. 7 in greater detail.

FIG. 8 illustrates the amplifier circuit 60 of FIG. 7 in greater detail and, in particular, illustrates the power control circuit 68 and switches 48 and 49 according to a presently preferred embodiment of the invention.

Switch 48 comprises a transistor circuit including NPN bipolar transistors 81 and 82, and switch 49 comprises a transistor circuit including PNP bipolar transistors 83 and 84. Diodes 86 and 87 are detector diodes to detect the positive cycles of the amplifier output signal 37 from line 38 and from the corresponding line of the other stereo channel, respectively. Transistor 88 is biased so that it is non-conductive, or "off" during the times the level of the positive cycle of signal 37 does not exceed the $V_{cc1}$ voltage. This, of course, is also the case if the signal voltage from the other channel on line 100 is less than the $V_{cc1}$ voltage. Biasing voltage for transistor 88 is developed by resistors 90, 91 and 92.

If, however, the level of the output signal 37 or the signal on line 60 exceeds the $V_{cc1}$ voltage, the voltage across resistor 90 will be driven to a sufficient level to trigger transistor 89 and to drive transistors 81 and 82 into saturation, thus turning switch 48 on to allow the $V_{cc2}$ voltage to be supplied to the transistor 31. When the level of signal 37 drops back below the value of the $V_{cc1}$ voltage, the voltage across resistor 90 will again fall to such a level that transistor 89 will again become non-conductive and turn off switch 48.

The operation of switch 49 is controlled in the same manner as switch 48, except that it operates on the negative cycles of output signal 37 and of the signal on the line 100 from the other stereo channel. Specifically, detector diodes 93 and 94 detect the negative cycles of signal 37 and the signal on the other channel, respectively. When the level of either of the negative signals 11 exceeds the $-V_{cc1}$ voltage, transistor 96 will be triggered "on", driving transistors 83 and 84 into saturation to turn switch 49 and to allow the $-V_{cc2}$ voltage to be supplied to transistor 32. Biasing of transistor 96 is provided by resistors 97, 98 and 99 in the same manner as in the positive $V_{cc2}$ control circuit.

The value of the biasing resistors and blocking capacitors and their specification will be apparent to one skilled in the art and depends upon the transistors selected to for the control circuit and the response times that are acceptable and desirable.

With the present invention, therefore, an audio power amplifier circuit is provided which will normally supply a first, relatively low supply voltage to the amplifier stage when it is sufficient to properly power the amplifier without output signal clipping. When, however, the level of the input signal is such that the output signal exceeds the first supply voltage, the circuit will automatically supply a second, relatively high supply voltage to the amplifier stage to accomodate the high level of the output signal.

The present invention thus provides a high dynamic power when required without having to increase continuous output power. Power dissipation on the amplifier is thus kept relatively low, and the amplifier efficiency is kept high. In addition, the power output requirement of the $V_{cc1}$ supply can be designed for a level consistent with normal operating levels and the $V_{cc2}$ supply can be designed to provide only that power needed to handle high level transients. Typically such transients, for example corresponding to bass, drums, timpani and the like, have a duration of only several cycles and the power required to drive the audio system output can be supplied with half wave rectification with sufficient filter/storage capacitors. Furthermore, since the higher voltage winding portion of the power transformer is not required to provide high currents, it can be wound with smaller wire, reducing the cost and size of the power supply transformer.

While what has been described constitutes a presently most preferred embodiment, those skilled in the art will recognize that the invention could be varied in a number of respects. For example, instead of employing transistor circuits for the switches 48 and 49, silicon-controlled rectifier circuits can be emloyed if desired. In addition, although the circuit is described as being capable of supplying two supply voltages, it could be modified to supply a greater number of supply voltages, each at a different value. Furthermore, although a specific control circuit has been described as a preferred embodiment for use in a stereo audio system, other circuit configurations may be used and the control circuit may be adapted for operation in a quadraphonic audio system.

It should be understood, therefore, that the invention should be limited only insofar as is required by the scope of the following claims.

I claim:

1. Amplifier apparatus comprising:
   amplifying means for receiving input signals and for producing amplified output signals;
   first means for supplying power to said amplifying means at a continuous amplifier power level and at a first, relatively low supply voltage;
   second means for supplying no more than the transient power required by said amplifying means and at a second, relatively high supply voltage;
   control means for coupling said first means to said amplifying means when the level of said amplified output signal is less than said first supply voltage and for coupling said second means to said amplifying means when the level of said amplified output signal is greater than said first supply voltage.

2. The amplifier apparatus of claim 1 wherein said control means includes switch means operable when said amplified output signal exceeds said first supply voltage for coupling said second means to said amplifying means.

3. The amplifier apparatus of claim 2 wherein said switch means is operable when said amplified output signal drops below said first supply voltage for coupling said first means to said amplifying means.

4. The amplifier apparatus of claim 2 wherein said switch means comprises a transistor circuit.

5. The amplifier apparatus of claim 1 wherein said control means includes means for monitoring the voltage of said amplified output signal and switch means for coupling said first means to said amplifying means when the voltage of said output signal does not exceed said first supply voltage and for coupling said second means to said amplifying means when the voltage of said output signal exceeds said first supply voltage.

6. The amplifier apparatus of claim 5 wherein said switch means comprises normally open switch means preventing said second supply voltage from being supplied to said amplifying means, and wherein said monitoring means includes trigger means for closing said switch means when said amplified output signal exceeds said first supply voltage.

7. The amplifier apparatus of claim 6 wherein said trigger means includes a transistor switching circuit for driving a semiconductor switching circuit into saturation thereby coupling said second relatively high supply voltage to said amplifying means.

8. The amplifier apparatus of claim 1 wherein said first and second supply means include power transformer means, said first means includes a full wave rectification and capacitive filter and said second means includes two half wave rectification circuits and capacitive filters.

9. Amplifier apparatus of claim 1 wherein said first means comprises a first power transformer means and said second power source means comprises a second power transformer means, said first power transformer means being capable of supplying power at said continuous amplifier power level, said second power transformer means being capable of supplying power at levels which do not exceed said transient power level.

10. The amplifier apparatus of claim 9 wherein said second means includes a capacitor means for storing energy from said second transformer means at said second voltage.

11. The amplifier apparatus of claim 10 wherein said control means includes means for monitoring the voltage of said amplified output signal and switch means for coupling said first means to said amplifying means when the voltage of said output signal does not exceed said first supply voltage and for coupling said capacitor means to said amplifying means when the voltage of said output signal exceeds said first supply voltage in order to effect transfer of said stored energy to said amplifier means.

12. Audio power amplifier apparatus comprising:
amplifying means for receiving input signals and for producing amplified output signals corresponding to said input signals;
a first power source means for supplying power to said amplifying means at a continuous amplifier power level and at a first relatively low supply voltage;
a second power source means for supplying no more than the transient power required by said amplifying means and at a second, relatively high supply voltage;
control means for monitoring said amplified output signal and for coupling said amplifying means to said first power source when the level of said amplified output signal is less than said first supply voltage and for coupling said second supply source to said amplifying means when the level of said amplified output signal exceeds said first supply voltage.

13. The amplifier apparatus of claim 12 wherein said first and second power sources comprise a power transformer and first and second conductive paths for coupling said power transformer to said amplifying means.

14. The amplifier apparatus of claim 13 wherein said control means includes switch means in said second conductive path, said switch means being normally open, and triggering means for closing said switch means when the level of said amplified output signal exceeds said first supply voltage.

15. The amplifier apparatus of claim 14 and further including diode means in said first conductive path for preventing said second supply voltage from affecting said first power source when said second supply voltage is being supplied to said amplifying means.

16. The amplifier apparatus of claim 14 wherein said switching means comprises a semiconductor switch.

17. The amplifier apparatus of claim 12 wherein said first power source means comprises a first power transformer means and said second power source means comprises a second power transformer means, said first power transformer means being capable of supplying power at said continuous amplifier power level, said second power transformer means being capable of supplying power at levels which do not exceed said transient power level.

18. The amplifier apparatus of claim 17 wherein said second power source means includes a capacitor means for storing energy from said second transformer means at said second voltage.

19. The amplifier apparatus of claim 18 wherein said control means includes means for monitoring the voltage of said amplified output signal and switch means for coupling said first means to said amplifying means when the voltage of said output signal does not exceed said first supply voltage and for coupling said capacitor means to said amplifying means when the voltage of said output signal exceeds said first supply voltage in order to effect transfer of said stored energy to said amplifier means.

* * * * *

UNITED STATES PATENT AND TRADEMARK OFFICE
CERTIFICATE OF CORRECTION

PATENT NO. : 4,598,255
DATED : July 1, 1986
INVENTOR(S) : Min-Tai Hong

It is certified that error appears in the above-identified patent and that said Letters Patent is hereby corrected as shown below:

IN THE BACKGROUND OF THE INVENTION

In column 1, line 9, please delete "On" and substitute therefor --One--.

IN THE BRIEF DESCRIPTION OF THE DRAWINGS

In column 3, line 5, please delete "ilustrates" and substitute therefor --illustrates--.

IN THE DETAILED DESCRIPTION OF THE PREFERRED EMBODIMENT

In column 3, line 29, please delete "voltges" and substitute therefor --voltages--;

In column 3, line 29, please delete "+$V_{cc}$applied" and substitute therefor --+$V_{cc}$ and -$V_{cc}$ applied--;

In column 6, line 2, please delete "$V_{cc2}$control" and substitute therefor --$V_{cc2}$ control--;

In column 6, line 16, please delete "accomodate" and substitute therefor --accommodate--;

UNITED STATES PATENT AND TRADEMARK OFFICE
CERTIFICATE OF CORRECTION

PATENT NO. : 4,598,255
DATED : July 1, 1986
INVENTOR(S) : Min-Tai Hong

It is certified that error appears in the above-identified patent and that said Letters Patent is hereby corrected as shown below:

In column 6, line 41, please delete "emloyed" and substitute therefor --employed--.

Signed and Sealed this

Nineteenth Day of April, 1988

Attest:

DONALD J. QUIGG

*Attesting Officer*       *Commissioner of Patents and Trademarks*